(12) United States Patent
Bigl et al.

(10) Patent No.: US 11,756,857 B2
(45) Date of Patent: Sep. 12, 2023

(54) ELECTRONIC CIRCUIT, POWER CONVERTER, AND METHOD FOR PRODUCING AN ELECTRONIC CIRCUIT

(71) Applicant: Siemens Aktiengesellschaft, Munich (DE)

(72) Inventors: Thomas Bigl, Herzogenaurach (DE); Alexander Hensler, Gerhardshofen (DE); Stephan Neugebauer, Erlangen (DE); Stefan Pfefferlein, Heroldsberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/617,844

(22) PCT Filed: Jun. 5, 2020

(86) PCT No.: PCT/EP2020/065627
§ 371 (c)(1),
(2) Date: Dec. 9, 2021

(87) PCT Pub. No.: WO2020/249479
PCT Pub. Date: Dec. 17, 2020

(65) Prior Publication Data
US 2022/0208643 A1 Jun. 30, 2022

(30) Foreign Application Priority Data
Jun. 11, 2019 (EP) .................................... 19179441

(51) Int. Cl.
*H01L 23/373* (2006.01)
*H05K 1/11* (2006.01)
(Continued)

(52) U.S. Cl.
CPC ...... *H01L 23/3735* (2013.01); *H01L 21/4807* (2013.01); *H01L 25/072* (2013.01);
(Continued)

(58) Field of Classification Search
CPC .......... H05K 1/02; H05K 1/0204; H05K 1/11; H05K 1/115; H05K 1/14;
(Continued)

(56) References Cited

U.S. PATENT DOCUMENTS 8,514,579 B2 * 8/2013 Stolze ..................... H01L 24/37
257/691
2007/0267739 A1 11/2007 Kajiwara et al.
(Continued)

FOREIGN PATENT DOCUMENTS

| DE | 10 2017 212 739 A1 | 1/2019 |
| EP | 3 139 407 A1 | 3/2017 |
| JP | 2014/027324 A | 2/2014 |

OTHER PUBLICATIONS

PCT International Search Report and Written Opinion of International Searching Authority dated Jul. 8, 2020 corresponding to PCT International Application No. PCT/EP2020/065627 filed Jun. 5, 2020.

*Primary Examiner* — Tuan T Dinh
(74) *Attorney, Agent, or Firm* — Henry M. Feiereisen LLC

(57) ABSTRACT

An electronic circuit has three circuit carriers and two semiconductor components. A first semiconductor component contacts with its upper side an underside of a first circuit carrier, and with its underside an upper side of a second circuit carrier. The first circuit carrier has vias, with a first via connecting the first semiconductor component to a first conducting path and a second via connecting a connection element forming a second conducting path providing an integral connection between the circuit carriers. A
(Continued)

second semiconductor component contacts the underside of the first circuit carrier and is electrically connected to the first or second conducting path. An underside of the second semiconductor component contacts an upper side of the third circuit carrier. A lateral thermal expansion coefficient of the first circuit carrier is greater than a lateral thermal expansion coefficient of both the second and the third circuit carrier.

39 Claims, 8 Drawing Sheets

(51) Int. Cl.
    *H01L 21/48*           (2006.01)
    *H01L 25/07*           (2006.01)
    *H01L 25/00*           (2006.01)
    *H05K 1/02*            (2006.01)
    *H05K 1/14*            (2006.01)
    *H05K 3/34*            (2006.01)
(52) U.S. Cl.
    CPC ........... *H01L 25/50* (2013.01); *H05K 1/0204* (2013.01); *H05K 1/115* (2013.01); *H05K 1/145* (2013.01); *H05K 3/341* (2013.01); *H05K 2201/068* (2013.01)
(58) Field of Classification Search
    CPC ........... H05K 1/141–145; H05K 3/341; H05K 2201/068; H01L 21/4807; H01L 23/3735
    USPC ................. 361/770–790, 803; 257/660–690; 439/76.2
    See application file for complete search history.

(56) References Cited

U.S. PATENT DOCUMENTS

| | | | |
|---|---|---|---|
| 2008/0130234 A1* | 6/2008 | Maehara | H05K 7/205 361/704 |
| 2014/0077354 A1 | 3/2014 | Yamamoto et al. | |
| 2014/0367736 A1* | 12/2014 | Iizuka | H01L 23/49811 438/107 |
| 2015/0223339 A1* | 8/2015 | Nakamura | H01L 23/3107 361/779 |
| 2015/0261265 A1* | 9/2015 | Dean | G01R 31/2891 361/679.46 |
| 2016/0192495 A1* | 6/2016 | Nakamura | H01L 23/5227 361/783 |
| 2016/0352244 A1* | 12/2016 | Cheng | H01L 23/3735 |
| 2016/0365307 A1* | 12/2016 | Miyakoshi | H01L 25/18 |
| 2017/0125359 A1* | 5/2017 | Sakai | H01L 25/117 |
| 2017/0236782 A1* | 8/2017 | Nonaka | H01L 25/072 257/667 |
| 2018/0114735 A1 | 4/2018 | Nakamura et al. | |
| 2018/0206359 A1* | 7/2018 | McPherson | H02M 7/003 |
| 2020/0161246 A1 | 5/2020 | Blank et al. | |

* cited by examiner

ELECTRONIC CIRCUIT, POWER CONVERTER, AND METHOD FOR PRODUCING AN ELECTRONIC CIRCUIT

CROSS-REFERENCES TO RELATED APPLICATIONS

This application is the U.S. National Stage of International Application No. PCT/EP2020/065627, filed Jun. 5, 2020, which designated the United States and has been published as international Publication No. WO 2020/249479 A1 and which claims the priority of European Patent Application, Serial No. 19179441.1, filed Jun. 11, 2019, pursuant to 35 U.S.C. 119(a)-(d).

BACKGROUND OF THE INVENTION

The present invention relates to an electronic circuit having a first circuit carrier and a second circuit carrier and having a power-electronics first semiconductor component with an upper side which lies against an underside of the first circuit carrier and an underside which lies against an upper side of the second circuit carrier. The circuit also has a third circuit carrier and a second semiconductor component. The invention further relates to a corresponding method for producing an electronic circuit.

In the field of power electronics, semiconductor components, e.g. switching elements, are normally provided in the form of power modules or discrete packages. The semiconductor components are contacted by means of specific wire-bond technologies in this case and the power modules are attached to a circuit carrier by means of soldered, sprung or compression connections, for example.

As a result of using the bonding wires, the maximum permitted current density through the semiconductor components is limited. Parasitic inductances can also occur, restricting an achievable switching speed of the switching elements.

In consideration of the above, one object of the present invention is to specify an improved concept for an electronic circuit having at least one power-electronics semiconductor component, by means of which the switching performance of the circuit is improved in order to increase a maximum achievable current density and switching speed.

According to the improved concept, this object is achieved by an electronic circuit and a method for producing an electronic circuit in accordance with the independent patent claims. Advantageous developments and further embodiment variants are specified in the dependent claims.

According to a first independent aspect of the improved concept, an electronic circuit is specified which has a first circuit carrier, a second circuit carrier, a third circuit carrier, a first power-electronics semiconductor component and a second semiconductor component. The first semiconductor component has an upper side which lies against an underside of the first circuit carrier and an underside which lies against an upper side of the second circuit carrier. The first circuit carrier has a first via which electrically connects the upper side of the first semiconductor component to a first conductor path of the first circuit carrier. The first circuit carrier has a second via which electrically connects a first connection element, arranged between the underside of the first circuit carrier and the upper side of the second circuit carrier, to a second conductor path of the first circuit carrier. The first connection element forms an integral and in particular electrical connection between the upper side of the second circuit carrier and the underside of the first circuit carrier, or an integral and in particular electrical connection between the upper side of the second circuit carrier and the underside of the first circuit carrier is formed by the first connection element. An upper side of the second semiconductor component lies against the underside of the first circuit carrier and is electrically connected to the first or the second conductor path.

The electronic circuit has a third circuit carrier in this case. An underside of the second semiconductor component lies against an upper side of the third circuit carrier. In particular, the underside of the second semiconductor component is electrically connected to the upper side of the third circuit carrier.

The foregoing explanations and if applicable further explanations relating to the second circuit carrier apply analogously to the third circuit carrier.

According to at least one embodiment variant, the second and third circuit carriers are arranged on a plane and are therefore in particular at the same distance from the first circuit carrier.

The respective upper sides of the circuit carriers or semiconductor components face the respective undersides of the circuit carriers or semiconductor components. Moreover, the designations "upper side" and "underside" do not represent in either case a restriction in relation to any possible spatial orientation of the corresponding components. The terms have been chosen for exemplary purposes and are based on an arrangement in which, from the top downwards, the first circuit carrier is arranged first, followed by the semiconductor components and then the second and if applicable further circuit carriers.

A side of a semiconductor component lying against a side of a circuit carder can be understood in particular to mean that in a contact region of the corresponding side of the circuit carrier, the corresponding side of the semiconductor component is oriented plane-parallel or substantially plane-parallel hereto and lies flat against said corresponding side of the circuit carrier. A flat connecting material, e.g. an adhesive, a soldering material or a sintering material, can be situated between the respective side of the semiconductor component and the respective side of the circuit carrier, or the two sides can be connected together directly, e.g. eutectically. In particular, there are no bonding wires between the respective semiconductor component and the associated circuit carrier.

The semiconductor components can be connected to the first circuit carrier, in particular by means of chip bonds (also referred to as die bonds). Chip-bonding must be considered as distinct from wire-bonding in particular, and a connection can be effected by means of a soldered or sintered connection, adhesive connection and/or eutectic connection, for example. The eutectic connection can also be referred to as eutectic soldering or alloying, for example. The same applies to the connection of the first semiconductor component to the second circuit carrier and, if applicable, the second semiconductor component to a third circuit carrier.

That the first semiconductor component is a power-electronics semiconductor component is understood to mean, for example, that in this case it is a type of semiconductor component which is suitable for use in power-electronics applications, i.e. particularly in applications for transforming electrical energy by means of switching electronic components.

The second semiconductor component can likewise be a power-electronics semiconductor component, for example.

Examples of power-electronics semiconductor components include diacs, triacs, power transistors, in particular bipolar power transistors, power MOSFETs or IGBTs, thyristors, e.g. GTO thyristors, power diodes or power capacitors.

The first circuit carrier can be in particular a multilayer circuit carrier, i.e. in particular a circuit carrier having two, three or more electrically conductive layers. The first and the second conductor path are in particular metallically separated from each other in the first circuit carrier. This means that considering the first circuit carrier alone, i.e. In particular without installed components, the first and the second conductor path are metallically separated from each other. In this case, the first and the second conductor path can be parts of the same electrically conductive layer or respectively parts of different electrically conductive layers.

The first connection element is in particular an electrically conductive connection body, e.g. a connection body for a soldered or sintered connection. The connection body consists of e.g. a soldering material or a sintering material in this case. In particular, the first connection element contains no bonding wire.

As a result of combining at least two circuit carriers with at least two semiconductor components in the manner described, it is possible to avoid a packaged module format in power-electronics circuits.

A power module normally contains a circuit carrier and a plurality of power semiconductors arranged on the circuit carrier. The individual power semiconductors are also interconnected electrically by means of bonding wires. The circuit carriers and the power semiconductors are located in a sealed package which can be coupled by means of contacting elements to a further circuit carrier or a busbar.

The improved concept makes it possible to avoid such bonding wire connections in particular, as well as the separate contacting elements between the power module package and the further circuit carrier.

Parasitic inductances caused by the bonding wires are thereby avoided and the performance potential, in particular the electrical loading capacity and the switching speed, of the available semiconductor components can be fully exploited. In particular, a maximum viable current density is no longer limited by a relatively small line cross section of bonding wires. The limiting of switching times due to parasitic inductances is also avoided thereby.

The higher current-carrying capacity is enabled in particular by the direct and flat connection of the chip surfaces to the circuit carriers. This also results in a better thermal connection and correspondingly improved heat dissipation.

In this case, a lateral thermal expansion coefficient of the first circuit carrier is greater than or equal to a lateral thermal expansion coefficient of the second circuit carrier and greater than or equal to a lateral thermal expansion coefficient of the third circuit carrier.

The lateral thermal expansion coefficient of a circuit carrier can be understood in this case to be a change in lateral extent, i.e. a change in length or width, of the respective circuit carrier in response to a predetermined temperature change, in particular relative to a predetermined starting temperature.

Owing to the lateral thermal expansion coefficient of the second circuit carrier being smaller than that of the first circuit carrier and an operating temperature of the electronic circuit always being lower than a joining temperature at which the circuit carriers are interconnected by the connection elements, a convex curvature of the second circuit carrier towards the heat sink is obtained as a result of the cooling. Accordingly, a thermal contact of the second circuit carrier is best in a central region of the second circuit carrier relative to the heat sink and also improves in the case of a higher operating temperature, since the convex curvature decreases until the joining temperature is reached. This corresponds to an optimal thermal connection.

By virtue of the arrangement according to the improved concept, it is moreover possible to achieve a particularly compact construction and therefore better integration of the electronic circuit, in particular a smaller space requirement.

According to at least one embodiment variant, the electronic circuit is a power-electronics circuit, i.e. an electronic circuit for use in the field of power electronics.

According to at least one embodiment variant, the first and the second semiconductor component are present on separate semiconductor chips.

According to at least one embodiment variant, the first circuit carrier completely overlaps the first and the second semiconductor component and the second circuit carrier. In other words, a lateral extent of the second circuit carrier is greater than a lateral extent of the first semiconductor component and smaller than a lateral extent of the first circuit carrier.

Lateral here and in the following signifies spatial directions parallel to layer planes of the semiconductor components and the circuit carriers.

According to at least one embodiment variant, the second circuit carrier completely overlaps the first semiconductor component.

According to at least one embodiment variant, the underside of the first semiconductor component is electrically connected to the upper side of the second circuit carrier.

According to at least one embodiment variant, the first connection element forms an electrical connection between the upper side of the second circuit carrier and the underside of the first circuit carrier.

According to at least one embodiment variant, the first circuit carrier contains a multilayer board. In this case, a board can be understood to mean a construction of one or more prepregs, one or more cores and one or more conduction layers, e.g. copper layers. In particular, the board can be an FR2, FR3, FR4 or FR5-based board or a CEM1 or CEM3-based board. In particular, the board or the first circuit carrier does not contain any flexible board, flexboard, flex-rigid or semiflexible board, in particular in the region of overlap with the second circuit carrier.

According to at least one embodiment variant, the first circuit carrier has a third via which electrically connects the upper side of the second semiconductor component to the second conductor path.

According to at least one embodiment variant, the first circuit carrier has a fourth via which electrically connects a second connection element arranged between the underside of the first circuit carrier and the upper side of the third circuit carrier to the first conductor path or to a third conductor path of the first circuit carrier. The second connection element forms an integral and in particular electrical connection between the upper side of the third circuit carrier and the underside of the first circuit carrier.

The foregoing explanations relating to the first connection element apply analogously to the second connection element.

According to at least one embodiment variant, the underside of the second semiconductor component is electrically connected to the upper side of the third circuit carrier.

According to at least one embodiment variant, the circuit has a heat sink on which the second circuit carrier is arranged.

According to at least one embodiment variant, the third circuit carrier is arranged on the heat sink.

The second and if applicable the third circuit carrier are in particular attached to the heat sink and in particular directly connected to the heat sink. The direct connection includes cases in which a connecting material, e.g. an adhesive, a soldering or sintering material, and/or a medium for improved thermal conductivity, e.g. a heat transfer compound, is located between the respective circuit carrier and the heat sink.

In such embodiment variants, a shared heat sink is used for both semiconductor components and for the second and the third circuit carrier. The shared heat sink can also be used for heat dissipation for further circuit carriers and/or semiconductor components of the circuit.

According to at least one embodiment variant, the circuit has a clamping device in order to press the second circuit carrier and if applicable the third circuit carrier onto the heat sink by means of a force effect on the first circuit carrier.

An improved mechanical contact, also therefore an improved thermal contact, is thereby achieved between the heat sink and the second circuit carrier and respectively between the heat sink and the third circuit carrier, and consequently between the heat sink and the semiconductor components.

The better thermal contact results in improved heat dissipation. The improved mechanical contact furthermore also results in improved reliability of the electrical circuit, since mechanical movements or stresses occurring during operation can be compensated more effectively.

According to at least one embodiment variant, the clamping device contains a clamping element, e.g. a clamping plate, which is arranged on an upper side of the first circuit carrier and e.g. rests thereon, said upper side facing away from the first and the second semiconductor component. The clamping element is mechanically connected to the heat sink.

According to at least one embodiment variant, the clamping element is designed as a plate which rests on the upper side of the first circuit carrier.

According to at least one embodiment variant, the heat sink has at least one thread, e.g. an internal thread, or an undercut. The clamping device has at least one screw and/or at least one expanding element. The first circuit carrier has at least one through-opening.

For example, the clamping device can have the at least one screw and the clamping element has likewise at least one through-opening. The at least one screw is passed through the at least one through-opening of the clamping element.

For example, the clamping device can have the at least one expanding element and the at least one expanding element is connected to the clamping element.

The at least one screw or the at least one expanding element is passed through the at least one through-opening of the first circuit carrier and is mechanically connected to the heat sink by means of the at least one thread thereof.

By virtue of the clamping device, the clamping element can exert a force on the first circuit carrier and therefore on the semiconductor components by means of the screws or expanding elements, such that the semiconductor components and the second and if applicable the third circuit carrier are pressed onto the heat sink.

According to at least one embodiment variant, the first semiconductor component is embodied as a power-electronics switching element.

According to at least one embodiment variant, the second semiconductor component is embodied as a power-electronics switching element.

The power-electronics switching element can contain e.g. a power transistor, e.g. a wide bandgap transistor, an IGBT, a bipolar power transistor or a power MOSFET.

The wide-bandgap power transistor is in particular a power transistor based on gallium nitride or silicon carbide.

According to at least one embodiment variant, the first and the second semiconductor component are interconnected by means of the first circuit carrier, in particular by means of the first and the second conductor path and if applicable by means of the third conductor path, to form a half-bridge circuit or part of another bridge circuit, e.g. a full-bridge circuit.

The half-bridge circuit has in particular a first and a second DC voltage connection interface and an AC voltage connection interface. The first conductor path is e.g. electrically connected to the first DC voltage connection interface. The second conductor path is e.g. electrically connected to the AC voltage connection interface. The third conductor path is e.g. electrically connected to the second DC voltage connection interface.

According to at least one embodiment variant, the second circuit carrier has a first electrically conductive layer, in particular a metal layer, forming the upper side of the second circuit carrier. The second circuit carrier further has an electrically insulating layer, in particular a ceramic layer or ceramic body, arranged on that side of the first electrically conductive layer which faces away from the first circuit carrier.

In particular, the third circuit carrier can be embodied in an identical or similar manner to the second circuit carrier.

As a result of using the electrically insulating layer, the electrical isolation of the semiconductor components relative to the heat sink is realized. As a result of using a ceramic layer, it is possible at the same time to ensure effective thermal conduction. Such an arrangement is also characterized by effective resistance to temperature cycles.

According to at least one embodiment variant, the ceramic layer contains aluminum oxide, aluminum nitride or silicon nitride, or consists of one of the cited compounds.

According to at least one embodiment variant, the second circuit carrier has a second electrically conductive layer, in particular a metal layer, arranged on that side of the electrically insulating layer which faces away from the first electrically conductive layer.

By virtue of the arrangement "conductive layer—insulating layer—conductive layer", it is possible in particular to achieve greater resilience against thermal distortion of the second circuit carrier. This applies in particular if the first and the second electrically conductive layer are produced from the same material and the second electrically conductive layer has a volume which is greater than or at least equal to that of the first electrically conductive layer.

For example, the second circuit carrier can take the form of a DBC or DCB substrate. DBC stands for "direct bonded copper", DCB for "direct copper bonded".

According to at least one embodiment variant, the first and/or the second electrically conductive layer consist of copper or a copper alloy.

According to a further independent aspect of the improved concept, a power converter is specified which has an electronic circuit according to the improved concept.

In this case, the electronic circuit is embodied in particular in such a way that the first and the second semiconductor component are interconnected by means of the first circuit carrier to form a half-bridge circuit or part of another bridge circuit.

A power converter can be understood to mean a device for converting electrical energy of a first type into electrical energy of a second type.

The power converter can be embodied in particular as a voltage system converter, an inverter, in particular a multi-level inverter, a rectifier or a DC/DC converter.

In this case, a voltage system converter can be understood to mean a power converter which converts a first AC voltage into a second AC voltage, in particular having a different frequency and/or phase position. An inverter can be understood to mean a power converter which converts a DC voltage into an AC voltage. A rectifier can be understood to mean a power converter which converts an AC voltage into a DC voltage. A DC/DC converter can be understood to mean a power converter which converts a first DC voltage into a second DC voltage.

According to at least one embodiment variant, the power converter has a shared circuit carrier and two or more electronic circuits, wherein each of the electronic circuits is embodied according to the improved concept. In this case, the circuit carrier forms the corresponding first circuit carrier for each of the electronic circuits. In other words, the first circuit carrier of each of the electronic circuits is provided by the shared circuit carrier of the power converter.

By virtue of a power converter according to the improved concept, it is therefore possible to dispense with bonding wires or other wire connections or plug-type connections. In particular, it is not necessary to provide power modules for the construction of the power converter. The corresponding advantages are derived from the advantages described above in relation to an electronic circuit according to the improved concept.

According to at least one embodiment variant of the power converter, the electronic circuits are so embodied as to each have a respective heat sink on which the second and if applicable the third circuit carrier is arranged.

According to at least one embodiment variant, the power converter has a shared heat sink. The shared heat sink forms the corresponding heat sink for each of the electronic circuits in this case. In other words, the heat sink of each of the electronic circuits is provided by the shared heat sink of the power converter.

According to at least one embodiment variant, the power converter has a shared clamping device or a plurality of clamping devices. In this case, the shared clamping device forms a respective clamping device for each of the electronic circuits as described above or the plurality of clamping devices form the respective clamping devices of the electronic circuits.

According to a further independent aspect of the improved concept, a method is specified for producing an electronic circuit, in particular an electronic circuit according to the improved concept. In this case, a first and a second circuit carrier are provided. A power-electronics first semiconductor component is attached to the second circuit carrier by means of chip bonding. A first connection element is deposited onto the first circuit carrier or onto the second circuit carrier. The first connection element is integrally connected to the first circuit carrier and to the second circuit carrier in such a way that the first connection element is electrically connected to a second conductor path of the first circuit carrier by means of a second via of the first circuit carrier. The first semiconductor component and a second semiconductor component are attached to the first circuit carrier by means of chip bonding in such a way that an upper side of the first semiconductor component is connected to a first conductor path of the first circuit carrier by means of a first via of the first circuit carrier and an upper side of the second semiconductor component is electrically connected to the second conductor path.

Possible sequences of the steps of the method are obvious to a person skilled in the art. In particular, the steps of the method need not necessarily be executed in the sequence described here.

According to at least one embodiment variant of the method for producing the electronic circuit, the second semiconductor component is attached to the first circuit carrier by means of chip bonding in such a way that an upper side of the second semiconductor component is electrically connected to the second conductor path by means of a third via of the first circuit carrier.

According to at least one embodiment variant, the second semiconductor component is attached to a third circuit carrier by means of chip bonding.

According to at least one embodiment variant, a second connection element is deposited onto the first or onto the third circuit carrier. The second connection element is integrally connected to the first circuit carrier and to the third circuit carrier in such a way that the second connection element is electrically connected to a third conductor path of the first circuit carrier or to the first conductor path by means of a fourth via of the first circuit carrier.

According to at least one embodiment variant, a heat sink is mechanically connected to the second circuit carrier and if applicable to the third circuit carrier.

In particular, the connecting of the heat sink to the second and if applicable to the third circuit carrier takes place after the integral connecting of the first connection element to the first and the second circuit carrier or if applicable after the integral connecting of the second connection element to the first circuit carrier and the third circuit carrier.

In particular, the first and the second circuit carrier and if applicable the third circuit carrier cool down between the integral connecting of the connection element or connection elements to the corresponding circuit carriers and the connecting of the heat sink to the corresponding circuit carriers.

A convex curvature of the second and if applicable the third circuit carrier towards the heat sink is thereby achieved, thus improving a thermal connection of the circuit carrier to the heat sink.

Further embodiments of the method according to the improved concept follow directly from the various embodiment variants of the electronic circuit or the power converter according to the improved concept and vice versa.

The embodiments variants of the method for producing an electronic circuit according to the improved concept directly indicate corresponding embodiment variants of a method for producing a power converter according to the improved concept.

BRIEF DESCRIPTION OF THE DRAWING

The invention is explained in greater detail below with reference to specific exemplary embodiments and associated schematic drawings. Identical or functionally identical elements may be denoted by the same reference signs in the figures. The description of identical or functionally identical elements is not necessarily repeated in relation to different figures.

DETAILED DESCRIPTION OF PREFERRED EMBODIMENTS

Figure 1:
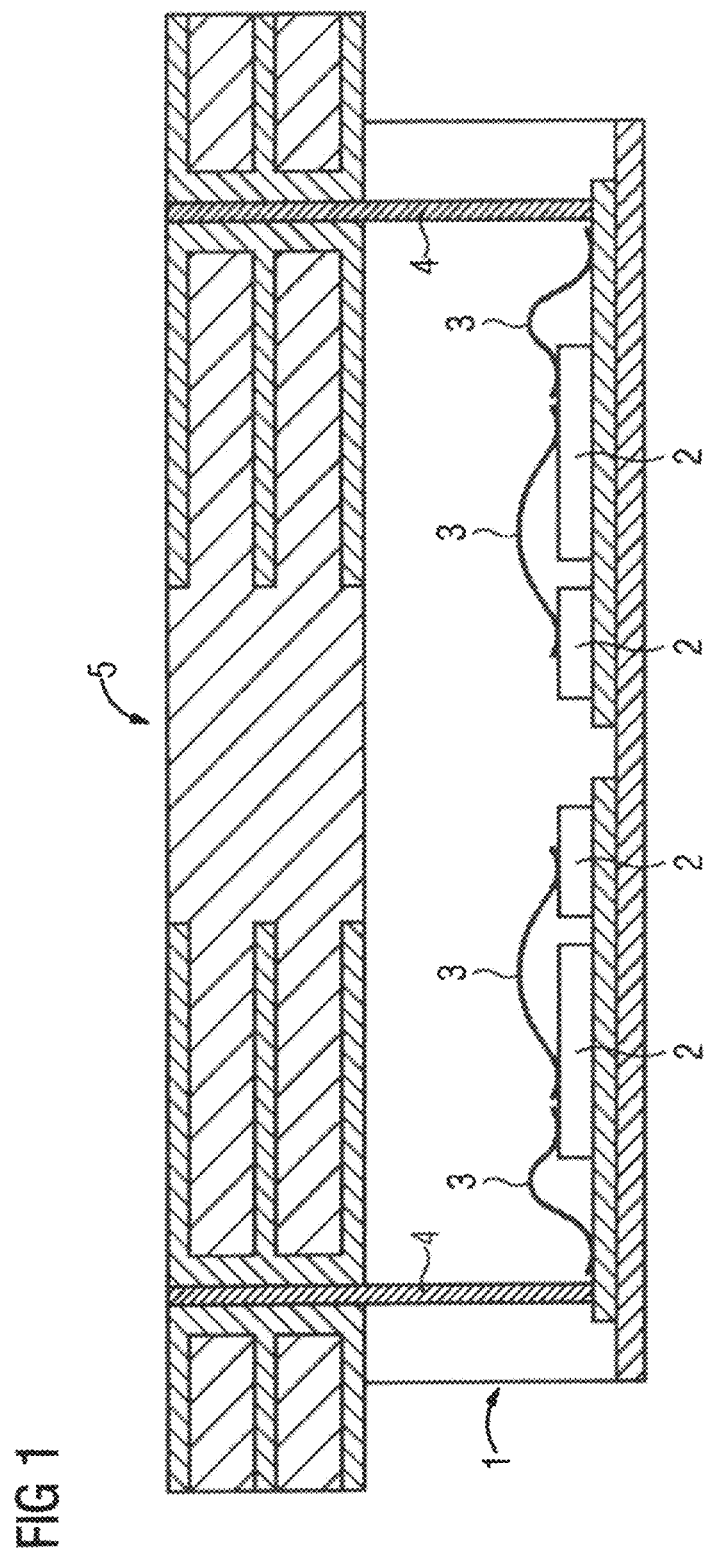
FIG. 1 shows a schematic sectional representation of a power module.

FIG. 1 shows a power module 1 in which a plurality of power-electronics switching elements 2 are electrically connected to metallic connection elements 4 by means of bonding wires 3. The power module 1 is connected to a board 5 by means of the connection elements 4.

Figure 2:
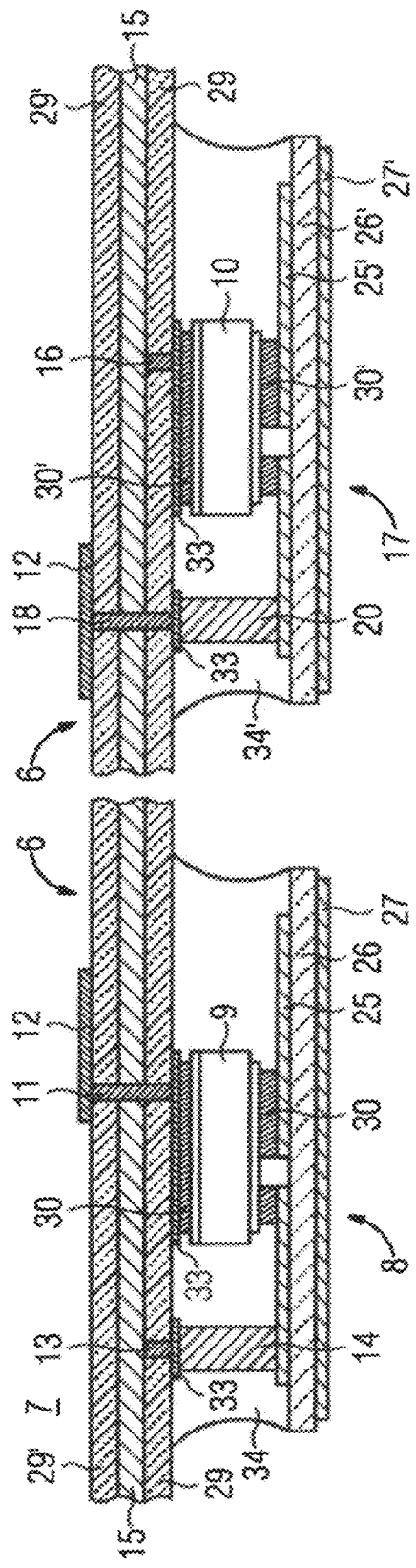
FIG. 2 shows a schematic sectional representation of an exemplary embodiment variant of an electronic circuit according to the improved concept.

FIG. 2 shows a sectional representation of an exemplary embodiment variant of an electronic circuit 7 according to the improved concept.

The electronic circuit 7 has a first circuit carrier 6 which takes the form of a multilayer board, for example. The circuit 7 also has a second circuit carrier 8 and a third circuit carrier 17 which are embodied as e.g. a DCB substrate in each case. The DCB substrates have e.g. a first copper layer 25, 25', a ceramic body or ceramic layer 26, 26' and a second copper layer 27, 27'. The ceramic layers 26, 26' are arranged between the copper layers 25, 25', 27, 27' in each case. In other embodiments, different metal layers can be used instead of the copper layers 25, 25', 27, 27'.

The circuit 7 has a first power transistor 9 which is connected by means of chip bonding to the first copper layer 25 of the second circuit carrier 8 and likewise by means of chip bonding to an outer layer 33, i.e. an exterior conduction layer, of the first circuit carrier 6.

In particular, a connecting material 30, e.g. an adhesive layer or a soldering or sintering material which was used for chip bonding, can be located between the first power transistor 9 and the first copper layer 25 and/or between the first power transistor 9 and the outer layer 33.

The circuit 7 additionally has a second power transistor 10 which is connected by means of chip bonding and if applicable using a corresponding connecting material 30' to the first circuit carrier 6, in particular the outer layer 33, and to the first copper layer 25' of the third circuit carrier 17.

The power transistors 9, 10 here and in the following are chosen solely by way of example in each case. In other embodiments, different power-electronics semiconductor components can be used instead of one of the power transistors 9, 10 or instead of both power transistors 9, 10.

Figure 3:
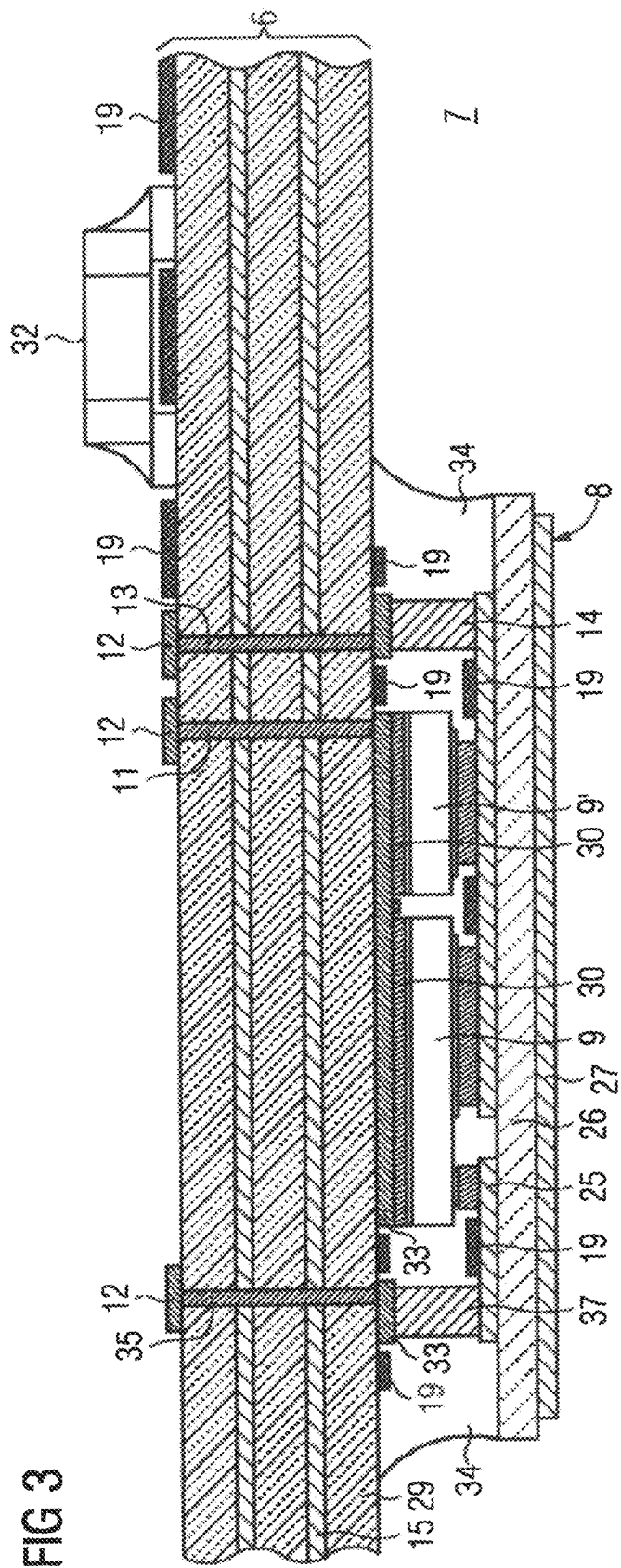
FIG. 3 shows a schematic sectional representation of a further exemplary embodiment variant of an electronic circuit according to the improved concept.

For the sake of clarity, only two of the three possible connection interfaces of the power transistors 9, 10 are shown as contacted. Reference is also made to FIG. 3 concerning this.

By way of example, the respective gate sides of the power transistors 9, 10 face the second circuit carrier 8 or the third circuit carrier 17 respectively.

The circuit has a first connection element 14 and a second connection element 20. The connection elements 14, 20 are composed of a soldering or sintering material, for example. The connection elements 14, 20 each form integral connections between the first copper layers 25, 25' and the outer layer 33. The connection elements 14, 20 can also be embodied as multipart elements in the form of different layers or as a composite.

The first circuit carrier 6 has a first insulation layer 29, e.g. on that side of the outer layer 33 which faces away from the power transistors 9, 10. An electrically conductive inner layer 15 of the circuit carrier 6 is e.g. arranged on that side of the insulation layer 29 which faces away from the outer layer 33. A further insulation layer 29' of the first circuit carrier 6 is e.g. arranged on that side of the inner layer 15 which faces away from the insulation layer 29, and a further outer layer 12 of the first circuit carrier 6 is arranged on that side of the further insulation layer 29' which faces away from the inner layer 15.

A first via 11 of the first circuit carrier 6 passes through the insulation layers 29, 29' and the inner layer 15 and connects the outer layer 33 to the outer layer 12, in particular connecting the first power transistor 9 to a conductor path of the outer layer 12.

A second via 13 of the first circuit carrier 6 passes through the insulation layer 29 and connects the outer layer 33 to the inner layer 15, in particular connecting the connection element 14 to a conductor path of the inner layer 15. A third via 16 likewise passes through the insulation layer 29 and connects the outer layer 33, in particular the second power transistor 10, to the conductor path of the inner layer 15.

A fourth via 18 passes through the insulation layer 29, the inner layer 15 and the further insulation layer 29' and connects the outer layer 33 to the outer layer 12, in particular connecting the second connection element 20 to the conductor path of the further outer layer 12 or to a further conductor path of the further outer layer 12.

The circuit 7 can have an encapsulating material 34 in which the first power transistor 9 and the first connection element 14 are embedded and which is produced with the aid of an underfiller, for example. Correspondingly, the circuit 7 can contain a further encapsulating material 34' in which the further power transistor 10 and the second connection element 20 are embedded and which can likewise be produced with the aid of an underfiller, for example.

An insulation of the second and third circuit carrier 8, 17 can overlap the corresponding conducting structures continuously on all sides, and in particular the structure carrying the semiconductor chips, e.g. by 0.5 mm or more.

FIG. 2 shows the power transistors 9, 10 connected in series. In alternative embodiments, the power transistors 9, 10 or corresponding further power-electronics components can be connected in parallel.

FIG. 3 shows a further sectional representation of a further exemplary embodiment variant of an electronic circuit 7 according to the improved concept. The circuit 7 according to FIG. 3 is similar to that in FIG. 2 and therefore only the differences are described in greater detail here. For the sake of clarity, the third circuit carder 17, the second power transistor 10, the second connection element 20 and the corresponding vias 16, 18 are not shown in FIG. 3.

The circuit 7 according to FIG. 3 has a diode 9' which is connected in particular antiparallel to the first power transistor 9.

In the circuit 7 according to FIG. 3, the vias 11, 13 are both connected to respective conductor paths on the further outer layer 12. Furthermore, the circuit 7 has a third connection element 37 which connects the first copper layer 25 to the further outer layer 12 by means of a fifth via 35. The foregoing explanations relating to the first connection element 14 apply analogously to the third connection element 37. The third contacting of the power transistor 9 is now also shown by the third connection element 37 and the fifth via 35. A corresponding contacting can also be provided in the circuit 7 according to FIG. 2.

The vias 11, 13 and 35 can lead to different or identical outer layers or inner layers in particular.

The circuit 7 also has a further electronic component 32, which can be embodied as e.g. a surface-mounted component and can be arranged in particular on that side of the first circuit carrier 6 which faces away from the power transistor 9, being e.g. electrically connected to the outer layer 12.

In the circuit 7 according to FIG. 3, solder resist structures 19 are also shown at various locations. These can be used e.g. to position the power transistor 9, the diode 9' and/or the electronic component 32 and/or to avoid uncontrolled wetting or spreading of soldering paste.

Figure 4:
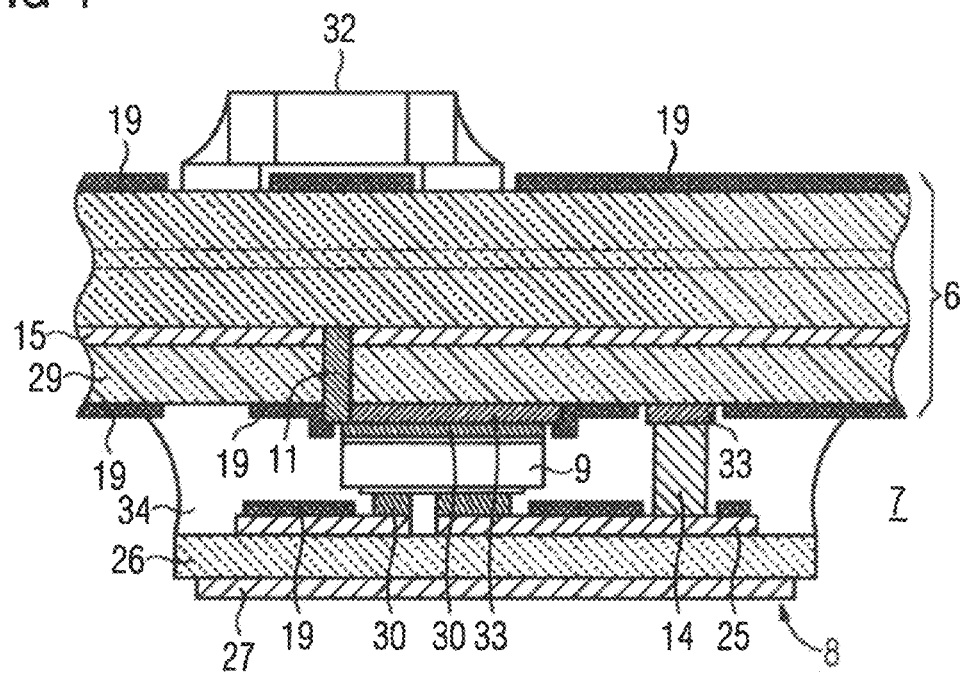
FIG. 4 shows a schematic sectional representation of a further exemplary embodiment variant of an electronic circuit according to the improved concept.

FIG. 4 shows a sectional representation of a further exemplary embodiment variant of the circuit 7 according to the improved concept. This embodiment variant is based on those in FIG. 2 and FIG. 3 and therefore only the differences are described in greater detail. Here likewise, the third circuit carrier 17 and the second power transistor 10 etc. have been omitted for the sake of clarity. As in FIG. 2, the contacting of the third contacting element of the power transistor 9 is not shown in FIG. 4 for the sake of clarity.

In contrast with FIG. 2, the first via 11 in FIG. 4 connects the power transistor 9 to the inner layer 15.

Figure 5:
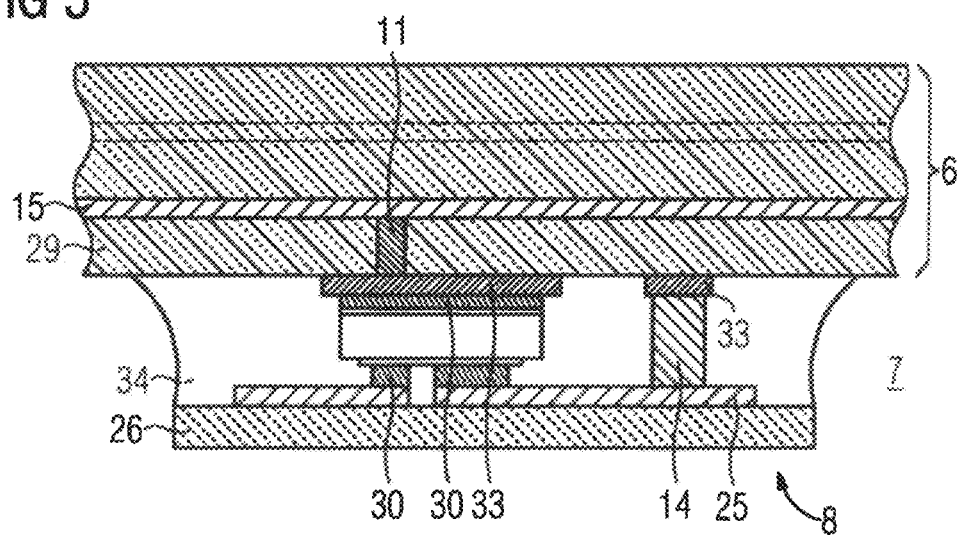
FIG. 5 shows a schematic sectional representation of a further exemplary embodiment variant of an electronic circuit according to the improved concept.

FIG. 5 shows a further sectional representation of a further exemplary embodiment variant of an electronic circuit 7 according to the improved concept. The circuit 7 according to FIG. 5 is based on that in FIG. 4.

In contrast with FIG. 2, FIG. 3 and FIG. 4, the second circuit carrier 8 in FIG. 5 is embodied with only one copper layer 25. In particular, the second circuit carrier 8 here has only the first copper layer 25 and the ceramic layer 26, but not the second copper layer 27.

Figure 6:
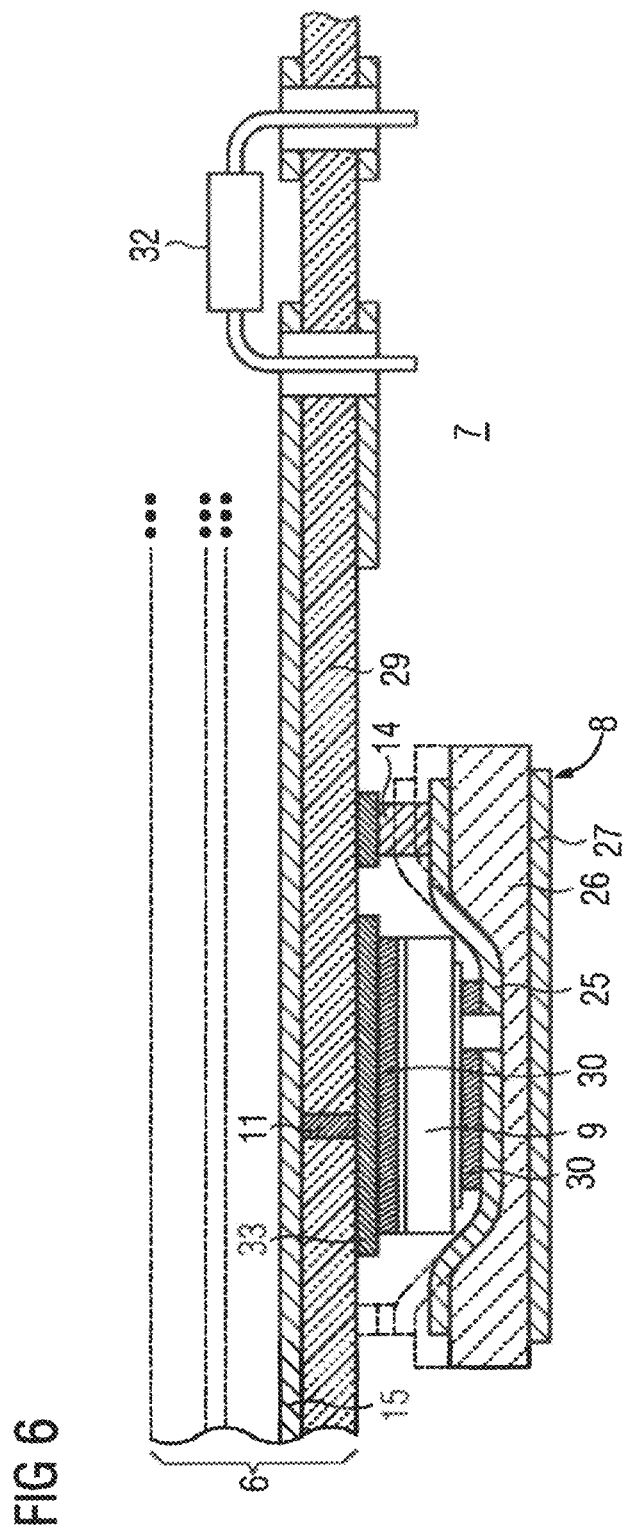
FIG. 6 shows a schematic sectional representation of a further exemplary embodiment variant of an electronic circuit according to the improved concept.

FIG. 6 shows a sectional representation through a further exemplary embodiment variant of an electronic circuit 7 according to the improved concept. The embodiment variant according to FIG. 6 is based on that in FIG. 4.

In contrast with FIG. 4, the further electronic component 32 is designed as a component for through-hole assembly.

Moreover, the second circuit carrier 8 is modified in comparison with FIG. 4. While in FIG. 4 the copper layers 25, 27 and ceramic layer 26 are in each case plane layers oriented parallel to each other, this is not the case in FIG. 6. The second copper layer 27 is unchanged in comparison with FIG. 4. However, the ceramic layer 26 has an indented or pan-shaped profile as viewed from the side. The copper layer 25 is shaped with approximately homogeneous thickness, such that it matches the profile of the ceramic layer 26 and likewise has an indented or pan-shaped profile.

A cavity is thereby formed within which the first power transistor 9 is at least partially arranged. The distances between the first copper layer 25 and the first circuit carrier 6 are consequently smaller than in the embodiment variant according to FIG. 4, assuming identical power transistors 9. Accordingly, the extent of the connection element 14, in particular a height of the connection element 14 which is required in order to bridge the distance between the copper layer 25 and the outer layer 33, can be smaller, potentially offering advantages in manufacturing. Assuming an appropriate embodiment of the pan-shaped profile, e.g. the connecting material 30 between the outer layer 33 and the power transistor 9 can be produced at the same time as the connection element 14 in a method step, particularly if identical corresponding layer thicknesses can be selected.

Figure 7:
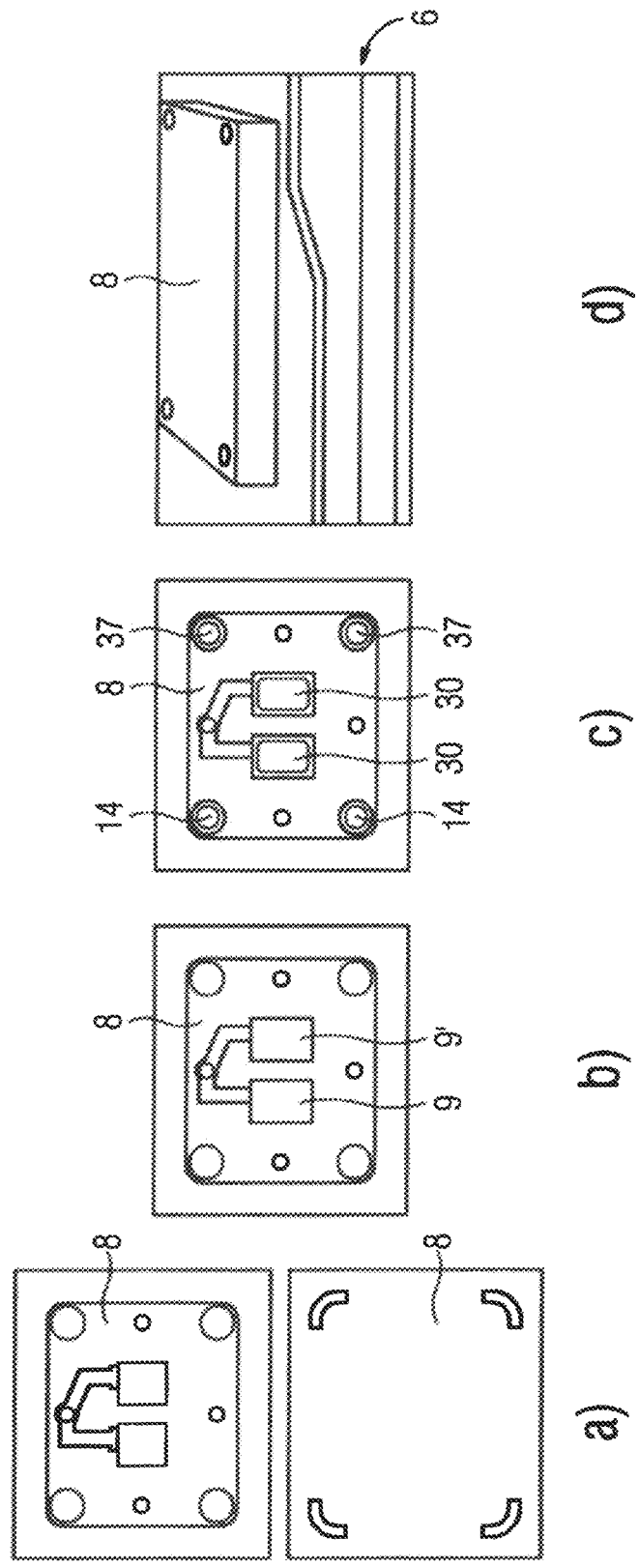
FIG. 7 shows a schematic representation of an exemplary embodiment variant of a method according to the improved concept.

FIG. 7 schematically shows a sequence diagram of a method for producing an electronic circuit according to the improved concept.

In step a) of the method, the first circuit carrier 6 and the second circuit carrier 8 are provided. In step b), e.g. the power transistor 9 and a further semiconductor component 9' are attached to the second circuit carrier 8 by means of chip bonding. In step c), the connection elements 14, 37 in the form of a soldering material or a soldering paste are deposited onto the second circuit carrier 8 together with the connecting material 30 for contacting the first power transistor 9 and the semiconductor component 9'. For example, the material for the connection elements 14, 37 is identical to the connecting material 30 on the semiconductor components 9 and 9'. In step d), the connection elements 14, 37 are integrally connected to the first circuit carrier 6, and the semiconductor component 9' and the power transistor 9 are likewise connected to the first circuit carrier 6 by means of the connecting material 30. The same procedure applies analogously to the third circuit carrier 17 and the second power transistor 10.

Figure 10:
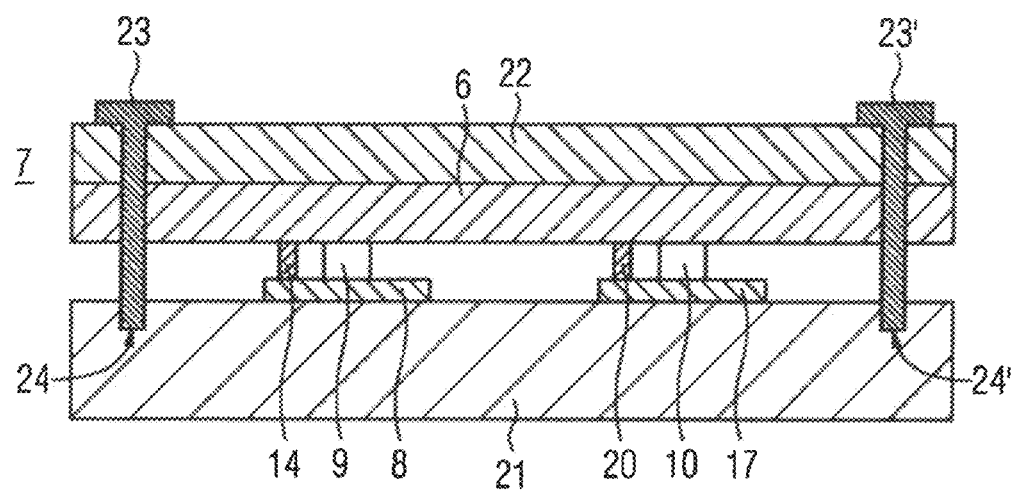
FIG. 10 shows a schematic sectional representation of a further exemplary embodiment variant of an electronic circuit according to the improved concept.

FIG. 10 shows a further sectional representation through a further exemplary embodiment variant of a circuit 7 according to the improved concept.

The embodiment variant according to FIG. 10 is based on that in FIG. 2 and therefore only the differences are described in greater detail.

The circuit 7 in FIG. 10 has a clamping plate 22 and a shared heat sink 21. The second and the third circuit carrier 8, 17 are arranged on the heat sink 21 while the clamping plate 22 rests directly or indirectly on the first circuit carrier 6 and is e.g. Insulated. The heat sink 21 has internally threaded holes 24, 24' which are aligned with through-openings that pass through the first circuit carrier 6 and through the clamping plate 22. By means of screws 23, 23' which are passed through the through-openings of both the clamping plate 22 and the first circuit carrier 6 and which engage in the holes 24, 24', the first circuit carrier 6, the second and third circuit carriers 8, 17 and correspondingly the power transistors 9, 10 are clamped or compressed between the heat sink 21 and the clamping plate 22. Particularly good thermal and mechanical contacting is achieved thereby.

Alternatively, instead of the two holes 24, 24' and the two screws 23, 23', the clamping plate 22 can contain only one hole and one screw which grips into a corresponding thread of the heat sink 21.

Alternatively, the clamping plate 22 can also be attached by means of an expanding element instead of the screw or screws, wherein the expanding element grips into an undercut in the heat sink 21.

Figure 8:
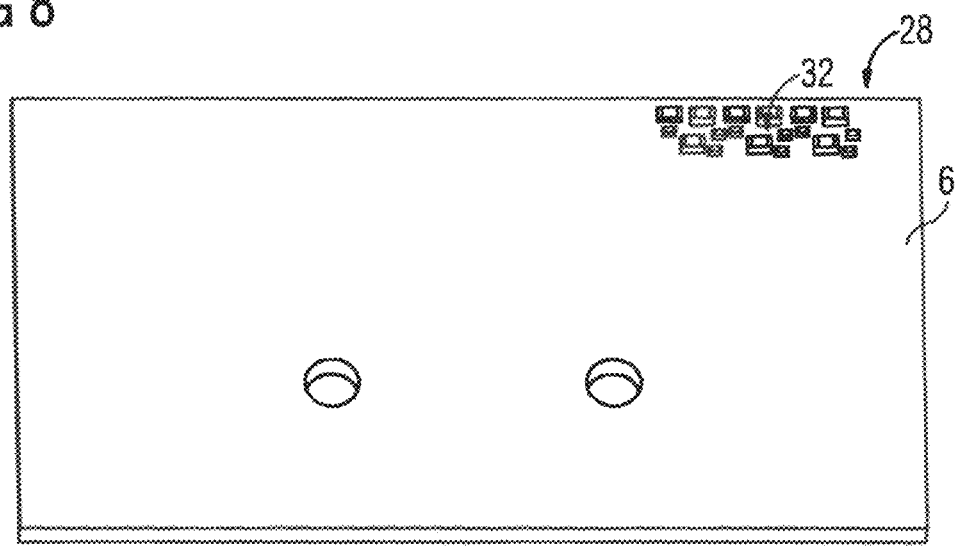
FIG. 8 shows a schematic representation of an exemplary embodiment variant of a power converter according to the improved concept.
Figure 9:
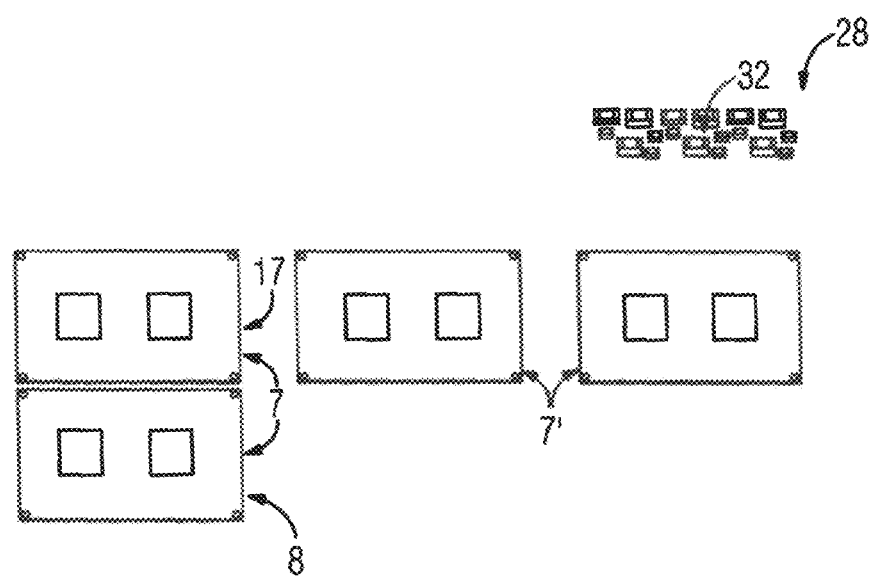
FIG. 9 shows an alternative representation of the power converter from FIG. 8.

FIG. 8 shows a schematic representation of an exemplary embodiment variant of part of a power converter 28, e.g. a voltage system converter, according to the improved concept. FIG. 9 shows the same part of the power converter 28, wherein the first circuit carrier 6 is not shown.

An electronic circuit 7 and a further electronic circuit 7', each of which is embodied according to the improved concept, are arranged on one side of the first circuit carrier 6. Various electronic components 32 are arranged on the other side of the first circuit carrier 6.

The circuits 7 and 7' are not necessarily separate. In alternative embodiment variants, they can also be partially connected in parallel, e.g. using the same intermediate circuit by means of the DC connection interfaces and different phase outputs (AC connection interfaces).

As shown in FIG. 8 and FIG. 9, a power converter 28 according to the improved concept can be achieved without power modules.

The improved concept offers a flexible approach to the provision of both an electronic circuit with power-electronics components and a power converter, allowing an overall system with particularly low inductance to be obtained by dispensing with bonding wires. The direct construction of the second and the third circuit carrier on the first circuit carrier, e.g. In an SMT process, allows quasi-ideal integration without the use of modules and therefore provides a beneficial means of fully exploiting the electrical performance of fast-switching power semiconductors.

In addition to the electrical interconnection of the individual circuit carriers, the flat connection elements can also have a good thermal conductivity, such that heat removal or a dampening action is further improved by the increased thermal capacity of the power semiconductors or of the connection elements.

The improved concept allows in particular a producer of power converters to forgo the use of the specific technologies required for conventional power module construction, e.g. wire bonding, and to realize a planar construction technology.

What is claimed is:

1. An electronic circuit comprising:
a first circuit carrier having a first via and a second via, a second circuit carrier, and a third circuit carrier;
a power-electronic first semiconductor component having an upper side that lies against an underside of the first circuit carrier and an underside which lies against an upper side of the second circuit carrier;
with the first via electrically connecting the upper side of the first semiconductor component to a first conductocsath of the first circuit carrier;
with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier;
and a second semiconductor component having an upper side that lies against the underside of the first circuit carrier and is electrically connected to the first conductor path or to the second conductor path, and an underside that lies against an upper side of the third circuit carrier;
a heat sink, with the second circuit carrier, being arranged on the heat sink;
a clamping device applying a force on the first circuit carrier, with the applied force pressing the second circuit carrier onto the heat sink,
wherein a lateral thermal expansion coefficient of the first circuit carrier is greater than a lateral thermal expansion coefficient of the second circuit carrier and greater than a lateral thermal expansion coefficient of the third circuit carrier, and
wherein the power-electronic first semiconductor component upper side is chip bonded to the underside of the first circuit carrier and the power-electronic first semiconductor component underside is chip bonded to the upper side of the second circuit carrier at two contacts with one of the two contacts being larger than the other, and the second semiconductor component upper side is chip bonded to the underside of the first circuit carrier and the second semiconductor component underside is chip bonded to the upper side of the third circuit carrier at two contacts with one of the two contacts being larger than the other.

2. The electronic circuit of claim 1, wherein the first circuit carrier has a third via that electrically connects the upper side of the second semiconductor component to the second conductor path.

3. The electronic circuit of claim 1, wherein the first circuit carrier has a fourth via that electrically connects a second connection element disposed between the underside of the first circuit carrier and the upper side of the third circuit carrier to the first conductor path or to a third conductor path of the first circuit carrier, with the second connection element forming an integral connection between the upper side of the third circuit carrier and the underside of the first circuit carrier.

4. The electronic circuit of claim 1, wherein the first semiconductor component or the second semiconductor component are embodied as power-electronic switching elements.

5. The electronic circuit of claim 1, wherein the first semiconductor component and the second semiconductor component are interconnected by the first circuit carrier to form a half-bridge circuit or part of another bridge circuit.

6. The electronic circuit of claim 1, wherein the second circuit carrier comprises a first electrically conductive layer forming the upper side of the second circuit carrier, and an electrically insulating layer disposed on a side of the first electrically conductive layer that faces away from the first circuit carrier.

7. The electronic circuit of claim 1, further comprising an encapsulating material in which the power-electronic first semiconductor component and the first connection element are embedded and which is produced with the aid of an underfiller.

8. The electronic circuit of claim 6, wherein the second circuit carrier comprises a second electrically conductive layer disposed on a side of the electrically insulating layer that faces away from the first electrically conductive layer.

9. An electronic circuit comprising:
a first circuit carrier having a first via and a second via a second circuit carder, and a third circuit carrier;
a power-electronic first semiconductor component having an upper side that lies against an underside of the first circuit carrier and an underside which lies against an upper side of the second circuit carrier;
with the first via electrically connecting the upper side of the first semiconductor component to a first conductor Path of the first circuit carrier;
with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier;

and a second semiconductor component having an upper side that lies against the underside of the first circuit carrier and is electrically connected to the first conductor path or to the second conductor path, and an underside that lies against an upper side of the third circuit carrier;

a heat sink, with the second circuit carrier being arranged on the heat sink;

a clamping device applying a force on the first circuit carrier, with the applied force pressing the second circuit carrier onto the heat sink, wherein a lateral thermal expansion coefficient of the first circuit carrier is greater than a lateral thermal expansion coefficient of the second circuit carrier and greater than a lateral thermal expansion coefficient of the third circuit carrier, and wherein the power-electronic first semiconductor component upper side is chip bonded to the underside of the first circuit carrier and the power-electronic first semiconductor component underside is chip bonded with a sintered connection to the upper side of the second circuit carrier at two contacts with one of the two contacts being larger than the other, and the second semiconductor component upper side is chip bonded to the underside of the first circuit carrier and the second semiconductor component underside is chip bonded with a sintered connection to the upper side of the third circuit carrier at two contacts with one of the two contacts being larger than the other.

10. The electronic circuit of claim 9, wherein the first circuit carrier has a third via that electrically connects the upper side of the second semiconductor component to the second conductor path.

11. The electronic circuit of claim 9, wherein the first circuit carrier has a fourth via that electrically connects a second connection element disposed between the underside of the first circuit carrier and the upper side of the third circuit carrier to the first conductor path or to a third conductor path of the first circuit carrier, with the second connection element forming an integral connection between the upper side of the third circuit carrier and the underside of the first circuit carrier.

12. The electronic circuit of claim 9, wherein the first semiconductor component or the second semiconductor component are embodied as power-electronic switching elements.

13. The electronic circuit of claim 9, wherein the first semiconductor component and the second semiconductor component are interconnected by the first circuit carrier to form a half-bridge circuit or part of another bridge circuit.

14. The electronic circuit of claim 9, wherein the second circuit carrier comprises a first electrically conductive layer forming the upper side of the second circuit carrier, and an electrically insulating layer disposed on a side of the first electrically conductive layer that faces away from the first circuit carrier.

15. The electronic circuit of claim 9, further comprising an encapsulating material in which the power-electronic first semiconductor component and the first connection element are embedded and which is produced with the aid of an underfiller.

16. The electronic circuit of claim 14, wherein the second circuit carrier comprises a second electrically conductive layer disposed on a side of the electrically insulating layer that faces away from the first electrically conductive layer.

17. An electronic circuit comprising:
a first circuit carrier having a first via and a second via, a second circuit carrier, and a third circuit carrier;

a power-electronic first semiconductor component having an upper side that lies against an underside of the first circuit carrier and an underside which lies against an upper side of the second circuit carrier;

with the first via electrically connecting the upper side of the first semiconductor component to a first conductor path of the first circuit carrier;

with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier;

and a second semiconductor component having an upper side that lies against the underside of the first circuit carrier and is electrically connected to the first conductor path or to the second conductor path, and an underside that lies against an upper side of the third circuit carrier;

a heat sink, with the second circuit carrier being arranged on the heat sink;

a clamping device applying a force on the first circuit carrier, with the applied force pressing the second circuit carrier onto the heat sink, wherein a lateral thermal expansion coefficient of the first circuit carrier is greater than a lateral thermal expansion coefficient of the second circuit carrier and greater than a lateral thermal expansion coefficient of the third circuit carrier, and wherein the power-electronic first semiconductor component upper side is chip bonded with a solder connection to the underside of the first circuit carrier and the power-electronic first semiconductor component underside is chip bonded with a sintered connection to the upper side of the second circuit carrier at two contacts with one of the two contacts being larger than the other and the sintered connection being thicker than the soldered connection, and the second semiconductor component upper side is chip bonded with a solder connection to the underside of the first circuit carrier and the second semiconductor component underside is chip bonded with a sintered connection to the upper side of the third circuit carrier at two contacts with one of the two contacts being larger than the other and the sintered connection being thicker than the soldered connection.

18. The electronic circuit of claim 17, wherein the first circuit carrier has a third via that electrically connects the upper side of the second semiconductor component to the second conductor path.

19. The electronic circuit of claim 17, wherein the first circuit carrier has a fourth via that electrically connects a second connection element disposed between the underside of the first circuit carrier and the upper side of the third circuit carrier to the first conductor path or to a third conductor path of the first circuit carrier, with the second connection element forming an integral connection between the upper side of the third circuit carrier and the underside of the first circuit carrier.

20. The electronic circuit of claim 17, wherein the first semiconductor component or the second semiconductor component are embodied as power-electronic switching elements.

21. The electronic circuit of claim 17, wherein the first semiconductor component and the second semiconductor component are interconnected by the first circuit carrier to form a half-bridge circuit or part of another bridge circuit.

22. The electronic circuit of claim 17, wherein the second circuit carrier comprises a first electrically conductive layer forming the upper side of the second circuit carrier, and an electrically insulating layer disposed on a side of the first electrically conductive layer that faces away from the first circuit carrier.

23. The electronic circuit of claim 17, further comprising an encapsulating material in which the power-electronic first semiconductor component and the first connection element are embedded and which is produced with the aid of an underfiller.

24. The electronic circuit of claim 22, wherein the second circuit carrier comprises a second electrically conductive layer disposed on a side of the electrically insulating layer that faces away from the first electrically conductive layer.

25. A power converter comprising:
two or more electronic circuits; and
a common circuit carrier which forms a corresponding first circuit carrier for each of the two or more electronic circuits;
the first circuit carrier having a first via and a second via, a second circuit carrier, and a third circuit carrier, a power-electronic first semiconductor component having an upper side that lies against an underside of the first circuit carrier and an underside which lies against an upper side of the second circuit carrier, with the first via electrically connecting the upper side of the first semiconductor component to a first conductor path of the first circuit carrier, with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier; and a second semiconductor component having an upper side that lies against the underside of the first circuit carrier and is electrically connected to the first conductor path or to the second conductor path, and an underside that lies against an upper side of the third circuit carrier; wherein a lateral thermal expansion coefficient of the first circuit carrier is greater than a lateral thermal expansion coefficient of the second circuit carrier and greater than a lateral thermal expansion coefficient of the third circuit carrier, and
wherein the power-electronic first semiconductor component upper side is chip bonded to the underside of the first circuit carrier and the power-electronic first semiconductor component underside is chip bonded to the upper side of the second circuit carrier at two contacts with one of the two contacts being larger than the other, and the second semiconductor component upper side is chip bonded to the underside of the first circuit carrier and the second semiconductor component underside is chip bonded to the upper side of the third circuit carrier at two contacts with one of the two contacts being larger than the other.

26. The power converter as claimed in claim 25, further comprising a shared heat sink which forms a corresponding heat sink for each of the two or more electronic circuits.

27. The electronic circuit of claim 25, further comprising an encapsulating material in which the power-electronic first semiconductor component and the first connection element are embedded and which is produced with the aid of an underfiller.

28. A power converter comprising:
two or more electronic circuits; and
a common circuit carrier which forms a corresponding first circuit carrier for each of the two or more electronic circuits;
the first circuit carrier having a first via and a second via, a second circuit carrier, and a third circuit carrier, a power-electronic first semiconductor component having an upper side that lies against an underside of the first circuit carrier and an underside which lies against an upper side of the second circuit carrier, with the first via electrically connecting the upper side of the first semiconductor component to a first conductor path of the first circuit carrier, with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier and a second semiconductor component having an upper side that lies against the underside of the first circuit carrier and is electrically connected to the first conductor path or to the second conductor path, and an underside that lies against an upper side of the third circuit carrier; wherein a lateral thermal expansion coefficient of the first circuit carrier is greater than a lateral thermal expansion coefficient of the second circuit carrier and greater than a lateral thermal expansion coefficient of the third circuit carrier, and
wherein the power-electronic first semiconductor component upper side is chip bonded to the underside of the first circuit carrier and the power-electronic first semiconductor component underside is chip bonded with a sintered connection to the upper side of the second circuit carrier at two contacts with one of the two contacts being larger than the other, and the second semiconductor component upper side is chip bonded to the second semiconductor component underside of the first circuit carrier and the second semiconductor component underside is chip bonded with a sintered connection to the upper side of the third circuit carrier at two contacts with one of the two contacts being larger than the other.

29. The power converter as claimed in claim 28, further comprising a shared heat sink which forms a corresponding heat sink for each of the two or more electronic circuits.

30. The electronic circuit of claim 28, further comprising an encapsulating material in which the power-electronic first semiconductor component and the first connection element are embedded and which is produced with the aid of an underfiller.

31. A power converter comprising:
two or more electronic circuits; and
a common circuit carrier which forms a corresponding first circuit carrier for each of the two or more electronic circuits;
the first circuit carrier having a first via and a second via, a second circuit carrier, and a third circuit carrier, a power-electronic first semiconductor component having an upper side that lies against an underside of the first circuit carrier and an underside which lies against an upper side of the second circuit carrier, with the first via electrically connecting the upper side of the first semiconductor component to a first conductor path of the first circuit carrier, with the second via electrically connecting a first connection element arranged between the underside of the first circuit carrier and the upper side of the second circuit carrier to a second conductor path of the first circuit carrier, the first connection element forming an integral connection between the upper side of the second circuit carrier and the underside of the first circuit carrier; and a second semiconductor component having an upper side that lies against the underside of the first circuit carrier and is electrically connected to the first conductor path or to the second conductor path, and an underside that lies against an upper side of the third circuit carrier; wherein a lateral thermal expansion coefficient of the first circuit carrier is greater than a lateral thermal expansion coefficient of the second circuit carrier and greater than a lateral thermal expansion coefficient of the third circuit carrier, and wherein the power-electronic first semiconductor component upper side is chip bonded with a solder connection to the underside of the first circuit carrier and the power-electronic first semiconductor component underside is chip bonded with a sintered connection to the upper side of the second circuit carrier at two contacts with one of the two contacts being larger than the other and the sintered connection being thicker than the soldered connection, and the second semiconductor component upper side is chip bonded with a solder connection to the underside of the first circuit carrier and the second semiconductor component underside is chip bonded with a sintered connection to the upper side of the third circuit carrier at two contacts with one of the two contacts being larger than the other and the sintered connection being thicker than the soldered connection.

32. The power converter as claimed in claim 31, further comprising a shared heat sink which forms a corresponding heat sink for each of the two or more electronic circuits.

33. The electronic circuit of claim 31, further comprising an encapsulating material in which the power-electronic first semiconductor component and the first connection element are embedded and which is produced with the aid of an underfiller.

34. A method for producing an electronic circuit, comprising:
providing a first, a second and a third circuit carrier, wherein a lateral thermal expansion coefficient of the first circuit carrier is greater than a lateral thermal expansion coefficient of the second circuit carrier and greater than a lateral thermal expansion coefficient of the third circuit carrier;
attaching a power-electronic first semiconductor component to the second circuit carrier by chip bonding;
attaching a second semiconductor component to the third circuit carrier by chip bonding;
placing a first connection element on the first circuit carrier or on the second circuit carrier;
integrally connecting the first connection element to the first circuit carrier and to the second circuit carrier such that the first connection element is electrically connected to a second conductor path of the first circuit carrier by a second via of the first circuit carrier;
attaching the first semiconductor component and the second semiconductor component to the first circuit carrier by chip bonding such that an upper side of the first semiconductor component is connected to a first conductor path of the first circuit carrier by a first via of the first circuit carrier, and an upper side of the second semiconductor component is electrically connected to the second conductor path;
arranging the second circuit carrier on a heat sink; and
applying on the first circuit carrier a force which presses the second circuit carrier onto the heat sink,
further comprising the power-electronic first semiconductor component upper side lying against an underside of the first circuit carrier and a power-electronic first semiconductor component underside lying against an upper side of the second circuit carrier at two contacts with one of the two contacts being larger than the other, and further comprising the second semiconductor component upper side lying against an underside of the first circuit carrier and a second semiconductor component underside lying against an upper side of the third circuit carrier at two contacts with one of the two contacts being larger than the other.

35. The method of claim 34, further comprising an encapsulating material in which the power-electronic first semiconductor component and the first connection element are embedded and which is produced with the aid of an underfiller.

36. A method for producing an electronic circuit, comprising:
providing a first, a second and a third circuit carrier, wherein a lateral thermal expansion coefficient of the first circuit carrier is greater than a lateral thermal expansion coefficient of the second circuit carrier and greater than a lateral thermal expansion coefficient of the third circuit carrier;
attaching a power-electronic first semiconductor component to the second circuit carrier by chip bonding;
attaching a second semiconductor component to the third circuit carrier by chip bonding;
placing a first connection element on the first circuit carrier or on the second circuit carrier;
integrally connecting the first connection element to the first circuit carrier and to the second circuit carrier such that the first connection element is electrically connected to a second conductor path of the first circuit carrier by a second via of the first circuit carrier;
attaching the first semiconductor component and the second semiconductor component to the first circuit carrier by chip bonding such that an upper side of the first semiconductor component is connected to a first conductor path of the first circuit carrier b a first via of the first circuit carrier, and an upper side of the second semiconductor component is electrically connected to the second conductor path;
arranging the second circuit carrier on a heat sink; and
applying on the first circuit carrier a force which presses the second circuit carrier onto the heat sink,
further comprising the power-electronic first semiconductor component upper side lying against an underside of the first circuit carrier and a power-electronic first semiconductor component underside lying against an upper side of the second circuit carrier with a sintered connection at two contacts with one of the two contacts being larger than the other, and further comprising the second semiconductor component upper side lying against an underside of the first circuit carrier and a second semiconductor component underside lying against an upper side of the third circuit carrier with a sintered connection at two contacts with one of the two contacts being larger than the other.

37. The method of claim 36, further comprising an encapsulating material in which the power-electronic first semiconductor component and the first connection element are embedded and which is produced with the aid of an underfiller.

38. A method for producing an electronic circuit, comprising:
providing a first, a second and a third circuit carrier, wherein a lateral thermal expansion coefficient of the first circuit carrier is greater than a lateral thermal expansion coefficient of the second circuit carrier and greater than a lateral thermal expansion coefficient of the third circuit carrier;
attaching a power-electronic first semiconductor component to the second circuit carrier by chip bonding;
attaching a second semiconductor component to the third circuit carrier by chip bonding;
placing a first connection element on the first circuit carrier or on the second circuit carrier;
integrally connecting the first connection element to the first circuit carrier and to the second circuit carrier such that the first connection element is electrically connected to a second conductor path of the first circuit carrier by a second via of the first circuit carrier;
attaching the first semiconductor component and the second semiconductor component to the first circuit carrier by chip bonding such that an upper side of the first semiconductor component is connected to a first conductor path of the first circuit carrier by a first via of the first circuit carrier, and an upper side of the second semiconductor component is electrically connected to the second conductor path;
arranging the second circuit carrier on a heat sink; and
applying on the first circuit carrier a force which presses the second circuit carrier onto the heat sink,
further comprising the power-electronic first semiconductor component upper side lying against an underside of the first circuit carrier with a solder connection and a power-electronic first semiconductor component underside lying against an upper side of the second circuit carrier with a sintered connection at two contacts with one of the two contacts being larger than the other and the sintered connection being thicker than the soldered connection, and further comprising the second semiconductor component upper side lying against an underside of the first circuit carrier with a solder connection and a second semiconductor component underside lying against an upper side of the third circuit carrier with a sintered connection at two contacts with one of the two contacts being larger than the other and the sintered connection being thicker than the soldered connection.

39. The method of claim 38, further comprising an encapsulating material in which the power-electronic first semiconductor component and the first connection element are embedded and which is produced with the aid of an underfiller.

* * * * *